US009538290B2

(12) United States Patent
Papp

(10) Patent No.: US 9,538,290 B2
(45) Date of Patent: Jan. 3, 2017

(54) COAXIAL LOUDSPEAKER ARRANGEMENT

(71) Applicants: MAGYAR INNOVÁCIÓS SZÖVETSÉG, Budapest (HU); NOVINEX INNOVÁCIÓ-ÉS KUTATÁS-HASZNOSITÓ IRODA, Budapest (HU)

(72) Inventor: Gergely Papp, Baks (HU)

(73) Assignee: Magyar Innovacios Szovetseg, Budapest (HU)

(*) Notice: Subject to any disclaimer, the term of this patent is extended or adjusted under 35 U.S.C. 154(b) by 0 days.

(21) Appl. No.: 14/428,779

(22) PCT Filed: Sep. 16, 2013

(86) PCT No.: PCT/HU2013/000094

§ 371 (c)(1),
(2) Date: Mar. 17, 2015

(87) PCT Pub. No.: WO2014/045070

PCT Pub. Date: Mar. 27, 2014

(65) Prior Publication Data

US 2015/0237449 A1 Aug. 20, 2015

(30) Foreign Application Priority Data

Sep. 17, 2012 (HU) ...................................... 1200534

(51) Int. Cl.
*H04R 25/00* (2006.01)
*H04R 7/16* (2006.01)
(Continued)

(52) U.S. Cl.
CPC *H04R 7/16* (2013.01); *H04R 7/02* (2013.01); *H04R 9/04* (2013.01); *H04R 1/24* (2013.01); *H04R 1/403* (2013.01)

(58) Field of Classification Search
CPC ........... H04R 1/24; H04R 1/403; H04R 9/063; H04R 9/00; H04R 7/02; H04R 7/044
(Continued)

(56) References Cited

U.S. PATENT DOCUMENTS 4,821,331 A 4/1989 Murayama et al.
5,604,815 A * 2/1997 Paddock ................ H04R 9/025 381/182

(Continued)

FOREIGN PATENT DOCUMENTS

DE 199 13 558 9/1999

*Primary Examiner* — Sunita Joshi
(74) *Attorney, Agent, or Firm* — Faegre Baker Daniels LLP

(57) ABSTRACT

Coaxial loudspeaker arrangement with an outer diaphragm (21) for operating in a lower frequency range, an inner diaphragm (23) for operating in a higher frequency range, both located in a common loudspeaker frame (10), with an outer voice coil (22) connected to the outer diaphragm (21), an inner voice coil (24) connected to the inner diaphragm (23), two coaxially arranged magnets (31, 32), and ferrite cores (41, 42, 43) in association with the magnets, wherein the voice coils (22, 24) extend into air gaps (51, 52) between the ferrite cores, and the diaphragms are connected to the loudspeaker frame (10) through flexible suspending elements (11-14). In the proposed loudspeaker, an inner core (41) and an outer core (42) separated from each other by an inner air gap (52), is located between an outer magnet (31) and an inner magnet (32); one ferrite core (43*a*) of the outer magnet (31) is separated by an outer air gap (51) from the outer core (42) located between the two magnets, wherein the voice coil (22) of the outer diaphragm (21) extends into the outer air gap (51) and the voice coil (24) of the inner diaphragm (23) extends into the inner air gap (52).

15 Claims, 3 Drawing Sheets

Figure 1:
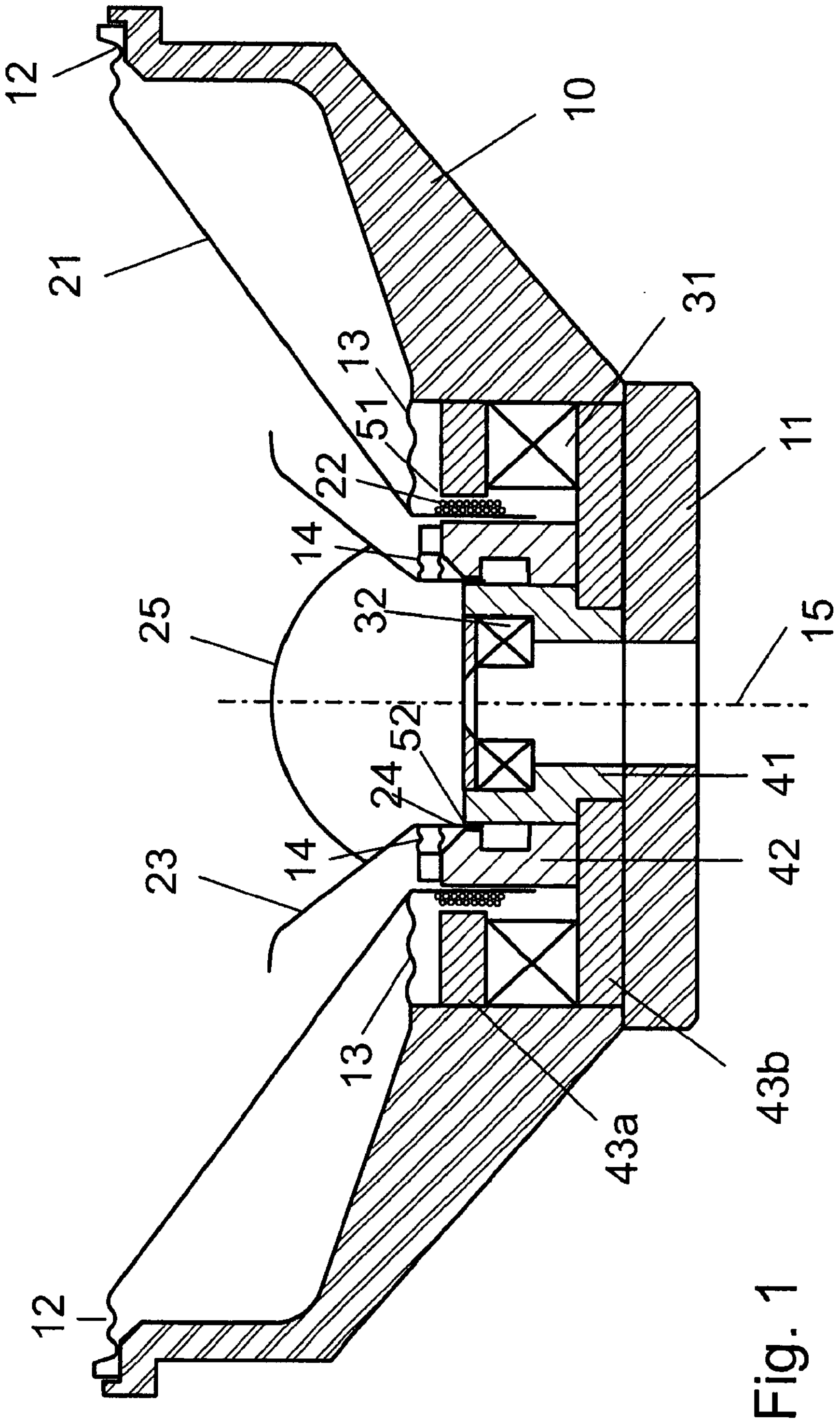

(51) Int. Cl.

| | |
|---|---|
| ***H04R 9/04*** | (2006.01) |
| ***H04R 7/02*** | (2006.01) |
| *H04R 1/00* | (2006.01) |
| *H05K 5/00* | (2006.01) |
| *H04R 1/40* | (2006.01) |
| *H04R 1/24* | (2006.01) |

(58) Field of Classification Search
USPC .......................... 381/182, 401, 412, 421, 424
See application file for complete search history.

(56) References Cited

U.S. PATENT DOCUMENTS

| | | | | |
|---|---|---|---|---|
| 6,269,168 | B1 | 7/2001 | Tagami | |
| 6,963,650 | B2 * | 11/2005 | Combest | H04R 1/24 381/182 |
| 2011/0170736 | A1 * | 7/2011 | Li | H04R 9/06 381/401 |

* cited by examiner

COAXIAL LOUDSPEAKER ARRANGEMENT

CROSS-REFERENCE TO RELATED APPLICATION

The present application is a National Stage of International Application No. PCT/HU2013/000094, filed Sep. 16, 2013, which claims priority to HU P1200534, filed Sep. 17, 2012, the entire disclosures of which are hereby expressly incorporated herein by reference.

TECHNICAL FIELD

The present invention relates to a coaxial loudspeaker arrangement with an outer diaphragm for operating in a lower frequency range, an inner diaphragm for operating in a higher frequency range, both located in a common loudspeaker frame, with an outer voice coil connected to the outer diaphragm, an inner voice coil connected to the inner diaphragm, two coaxially arranged magnets, and ferrite cores in association with the magnets, wherein the voice coils extend into air gaps between the ferrite cores, and the diaphragms are connected to the loudspeaker frame through flexible suspending elements.

BACKGROUND ART

Loudspeakers as electro-acoustic converters, are in known in a great variety (as for power and frequency range). As a speaker with only one diaphragm is not suitable for providing full performance over the whole audible frequency range, in order to provide better acoustic performance, more, preferably two (high- and low-range) or three (high-middle and low-range) speakers are combined in a speaker system, which can be connected to an output of an acoustic power amplifier via a two- or three-way crossover. Generally, speaker systems with multiple speakers of that kind can only be mounted into relatively large speaker boxes.

In order to reduce the required space and thus the size of such a loudspeaker box, a solution is provided by a coaxial arrangement of the different speakers in a common frame. Current loudspeakers of car radios and of car amplifiers have generally coaxial arrangement, providing a relatively wide audio frequency range with little space requirement. Due to the smaller size, the loudspeakers with coaxial configuration have less power output, e.g. the current load capacity is more limited when compared to multi-speaker systems of larger size. Higher voltage- or current load in such conventional multi-speaker systems will lead to higher distortion and shorter life time.

Patent document DE19913558 discloses a coaxial loudspeaker, in which between the voice coil of the outer subwoofer diaphragm and the voice coil of the inner tweeter diaphragm, there is only a single common magnetic circuit between ferrite cores. The loudspeaker is small in size and weight, but it is not suitable to provide higher power audio output. A further problem arises from the fact that both of the diaphragm voice coils move in a magnetic field of substantially the same strength, which, without appropriate frequency dependent compensation, would cause distortion.

U.S. Pat. Nos. 6,963,650 and 4,821,331 disclose coaxial loudspeakers, in which the voice coil of the subwoofer diaphragm and the voice coil of the tweeter diaphragm are located in two different magnetic circuits, between ferrite cores. These solutions provide for the possibility to control the different voice coils in magnetic fields of different strength, but the arrangement of the two diaphragms in two planes above each other leads to a difficult construction and to a higher weight.

Therefore, it is an object of the present invention to provide a coaxially arranged loudspeaker, which has a relatively small size at a high audio power output, a wide audio frequency band and a high current load capacity. It is a further aim of the present invention to provide a coaxial loudspeaker arrangement with a low distortion and a longer life time even at higher power output in contrast to similar loudspeakers known from the prior art.

SUMMARY OF THE INVENTION

The object of the invention is achieved generally with a coaxial loudspeaker arrangement as defined in claim 1. Further advantageous embodiments and examples can be found in the dependent claims.

The present invention relates to a coaxial loudspeaker arrangement with an outer diaphragm for operating in a lower frequency range, an inner diaphragm for operating in a higher frequency range, both located in a common loudspeaker frame, with an outer voice coil connected to the outer diaphragm, an inner voice coil connected to the inner diaphragm, two coaxially arranged magnets, and ferrite cores in association with the magnets, wherein the voice coils extend into air gaps between the ferrite cores and the diaphragms are connected to the loudspeaker frame through flexible suspending elements. According to an aspect of the invention, the coaxial loudspeaker arrangement comprises an inner core and an outer core separated from each other by an inner air gap, between an outer magnet and an inner magnet, one ferrite core of the outer magnet is separated by an outer air gap from the outer core located between the two magnets, wherein the voice coil of the outer diaphragm extends into the outer air gap and the voice coil of the inner diaphragm extends into the inner air gap.

Such a design ensures that the two voice coils will operate in magnetic fields of different strength, and the two magnets provide for both voice coils a magnetic field of sufficiently high strength. With increasing magnetic field, the sensitivity of the loudspeaker and the power output will be higher. The voice coils operating in magnetic fields of different strength will decrease the distortion of the loudspeaker even at a higher power output.

In one preferred embodiment, at least a part of the inner magnet and at least a part of the outer magnet is located in the same plane. This configuration enables the reduction of the size of the loudspeaker. Further, in this configuration, the upper plane surface of the inner magnet is located preferably in proximity of the upper plane surface of the outer magnet, above the upper plane surface of the outer magnet, and the lower plane surface of the inner magnet is located between the upper plane surface and the lower plane surface of the outer magnet.

According to a further aspect of the invention, the outer magnet is located between a lower and an upper core (pole core), wherein the outer diameter of the two ferrite cores is substantially equal to the outer dimension of the outer magnet, and air gap between the inner diameter of the upper ferrite core and the outer diameter of the outer ferrite core is selected in accordance with the dimension of the outer voice coil. The upper plain surface of the outer magnet is located substantially in the same plane as the upper plane surface of the upper ferrite core, and the upper plane surface of the inner ferrite core is located in proximity of the upper plane surface of the outer ferrite core, below the upper plane surface of the outer ferrite core.

In a further advantageous embodiment, the outer ferrite core comprises a head portion adjacent to the inner voice coil, and a foot portion fitting to the inner ferrite core, wherein the air gap between the inner diameter of the head portion of the outer ferrite core and the outer diameter of the inner ferrite core is selected in accordance with the dimension of the inner voice coil.

In a further preferred embodiment, a hollow middle portion is formed between the head portion and the foot portion of the outer ferrite core, and the head portion comprises a conical surface extending from a higher outer wall to a lower inner wall.

The inner ferrite core has a substantially cylindrical shape with a recess in the upper part for accommodating the inner magnet. This recess can be used for positioning the inner magnet, e.g. for locating the inner magnet coaxially with the loudspeaker axis.

The upper plane surface of the inner ferrite core is located preferably higher than the upper plane surface of the inner magnet, thus the inner magnet inserted into the inner ferrite core can be covered with a ferrite core having the shape of a circular disc and fitting within the recess of the inner ferrite core.

In the lower region of the outer surface of the inner ferrite core a circumferential recess is formed for fitting with the inner edge of the lower ferrite core. This recess can be used for positioning the inner ferrite core, e.g. for locating the inner ferrite core coaxially with the loudspeaker axis.

The north pole and the south pole of the outer magnet are directed preferably towards the upper and lower ferrite core.

In a preferred embodiment of the invention, the north pole and the south pole of the inner magnet are directed inwardly and outwardly, and the outwardly directed pole of the inner magnet is identical with the pole of the outer magnet which is directed to the upper ferrite core.

In a further preferred embodiment of the invention, at least one of the voice coils has multiple layers, wherein the number of layers above each other is variable along the coil. In a preferred embodiment, the voice coil has a conical shape in cross section, with more windings above each other on the diaphragm side, and less windings on the other side opposite the diaphragm. Such a configuration may contribute to a substantial reduction of the unpleasant audio effect, generally known from conventional loudspeakers, which is produced when a driving power amplifier is connected or the level of the audio frequency signal changes to a great extent.

The magnets used for the loudspeaker arrangement according to the present invention are permanent magnets with a material of neodymium or comprising neodymium.

SHORT DESCRIPTION OF THE DRAWING

Figure 2:
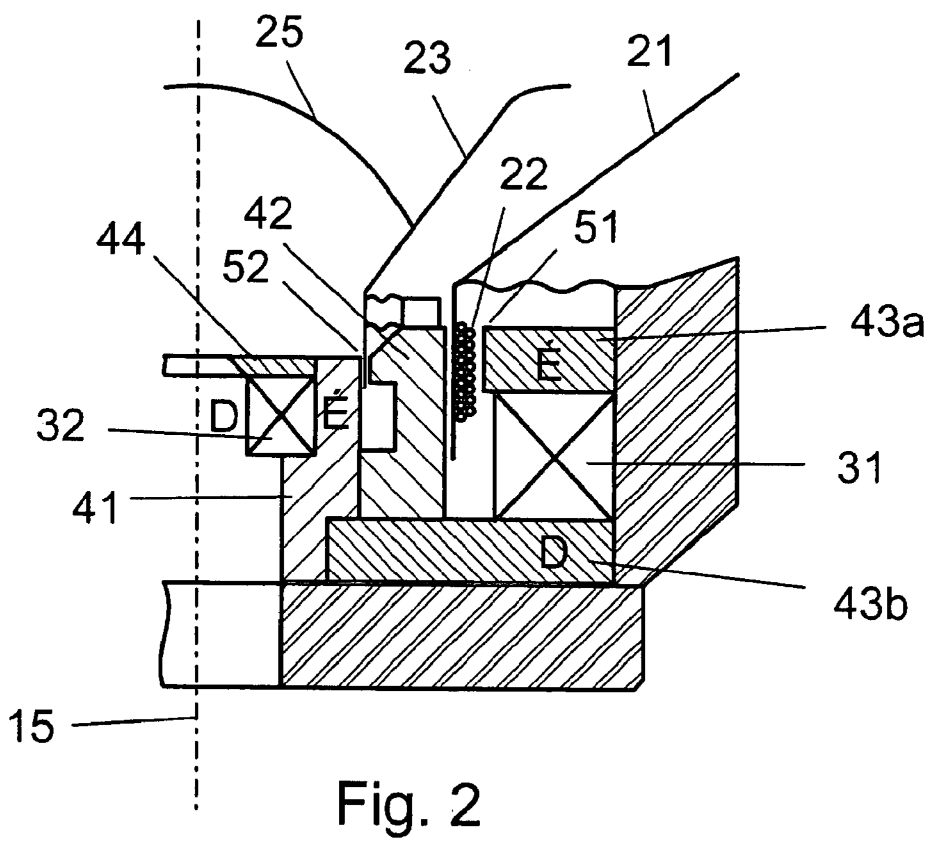
Figure 3A:
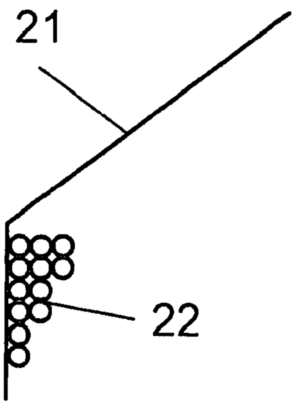
Figure 3B:
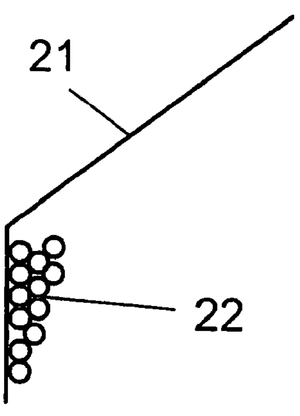
Figure 4:
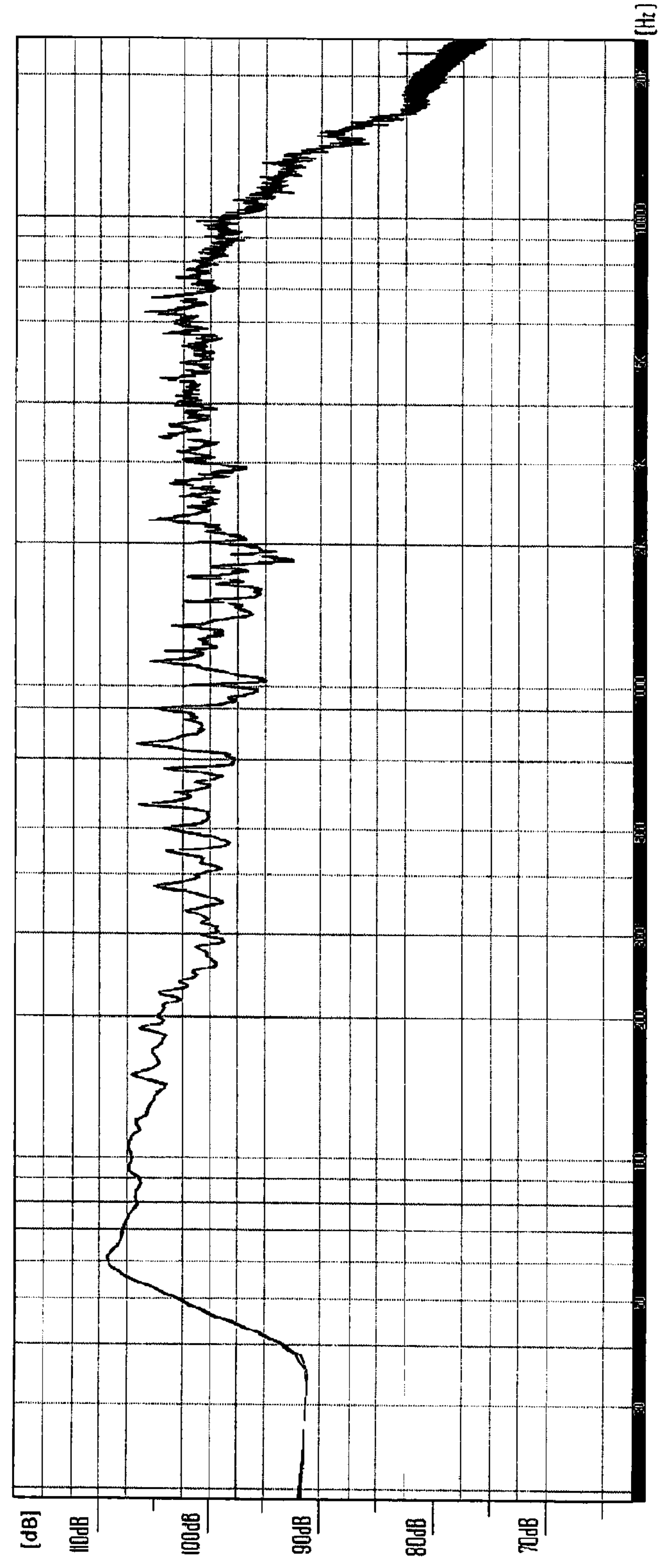

The invention will be described in more detail with reference to the embodiments shown in the drawing in which FIG. 1 shows a coaxial loudspeaker arrangement according to the present invention in a lateral cross-sectional view, FIG. 2 is an enlarged view of a detail of the coaxial loudspeaker arrangement of FIG. 1, FIG. 3 is an enlarged view of a detail of a voice coil of the coaxial loudspeaker arrangement of FIG. 1, and FIG. 4 is a frequency response diagram of the coaxial loudspeaker arrangement according to the present invention.

DETAILED DESCRIPTION OF THE EMBODIMENTS

In FIG. 1, a coaxial loudspeaker arrangement according to the present invention is shown in a lateral cross-sectional view. As it can be seen, the coaxial loudspeaker arrangement has a common loudspeaker frame 10 with a disc shaped base plate 11, with radially extending ribs which are connected and terminated by a circular rim. The loudspeaker frame is basically non magnetic, and thus can be prepared from a plastic material. In order to withstand higher strain and power, it may be preferably made of a non magnetic metal, advantageously of aluminium or an aluminium alloy. A loudspeaker frame of metal, such as aluminium is also suitable for heat transfer.

An outer diaphragm 21 operating in a lower frequency band and provided with an outer voice coil 22 is secured to the circular upper rim and a circular lower rim through flexible suspension elements (spider) 12 and 13. An inner diaphragm 23 provided with an inner voice coil 24 and operating in a higher frequency band is arranged concentric to the outer diaphragm and is secured to the outer ferrite core 42 through flexible suspension elements (spider) 14. The loudspeaker arrangement has two coaxially arranged magnets 31 and 32 and ferrite cores 41, 42 and 43 are associated with the magnets. The voice coils 22 and 24 extend into the air gaps 51, 52 between the ferrite cores. The outer diaphragm 21 is connected to the loudspeaker frame 10 through flexible suspension elements 12 and 13. The inner diaphragm 14 is coupled to a ferrite core 42 through a flexible suspension element 14. The opening of the inner diaphragm 23 is covered by a dust cap 25.

Further, there is provided an inner core 41 and an outer core 42, located between the outer magnet 31 and the inner magnet 32 and separated from each other by an inner air gap 52. The upper ferrite core 43*a* above the outer magnet 31 is separated from the outer core 42 located between the two magnets by an outer air gap 51. The voice coil 22 of the outer diaphragm 21 extends into the outer air gap 51 and the voice coil 24 of the inner diaphragm 23 extends into the inner air gap 52. Surprisingly, we have found that such a magnet configuration results in an improved power output, a decreased distortion and a higher current load capacity of the loudspeaker.

At least a part of the inner magnet 32 and at least a part of the outer magnet 31 is located in the same plane. In the configuration shown in the drawing, the upper plane surface of the inner magnet 32 is located preferably in proximity of the upper plane surface of the outer magnet 31, above the upper plane surface of the outer magnet 31, and the lower plane surface of the inner magnet 32 is located between the upper plane surface and the lower plane surface of the outer magnet 31.

The outer magnet 31 is located between a lower and an upper ferrite core 43*a*, 43*b*, wherein the outer diameter of the two ferrite cores 43*a*, 43*b* is essentially equal to the outer dimension of the outer magnet 31. The dimension of the air gap 51 between the inner diameter of the upper ferrite core 43*a* and the outer diameter of the outer ferrite core 42 is selected in accordance with the dimension of the outer voice coil 22. The dimension of the outer air gap 51 is between 2 and 4 mm, preferably 3 mm.

The upper plain surface of the outer ferrite core 42 is located substantially in the same plane as the upper plane surface of the upper ferrite core 43*a*, and the upper plane surface of the inner ferrite core 41 is located in proximity of the upper plane surface of the outer ferrite core 42, below the upper plane surface of the outer ferrite core 42.

The outer ferrite core 42 comprises a head portion adjacent to the inner voice coil 24, and a foot portion fitting to the inner ferrite core 41. The dimension of the air gap 52 between the inner diameter of the head portion of the outer ferrite core 42 and the outer diameter of the inner ferrite core 41 is selected in accordance with the dimension of the inner voice coil 24. The dimension of the inner air gap 52 is between 1 and 2 mm, preferably 1.5 mm.

Further, a hollow middle portion is formed between the head portion and the foot portion of the outer ferrite core 42, and the head portion comprises a conical surface extending from a higher outer wall to a lower inner wall. The inner ferrite core 41 has a substantially cylindrical shape with a recess in the upper part for receiving the inner magnet 32.

The upper plane surface of the inner ferrite core 41 is located higher than the upper plane surface of the inner magnet 32, thus the inner magnet 32 inserted into the inner ferrite core 41 can be covered with a ferrite core 44 having the shape of a circular disc and fitting within the recess of the inner ferrite core 41. The ferrite core 44 is provided with a central opening with a dimension substantially equal to the dimension of the inner opening of the inner magnet 32. In the embodiment shown in the drawing, the opening of the ferrite core 44 has a conical wall with a smaller diameter being equal to the inner diameter of the inner magnet 32 and the diameter of the opening decreases upwardly. In the lower region of the outer surface of the inner ferrite core 41 a circumferential recess is formed to mate with the inner edge of the lower ferrite core 43*b*.

The north pole and the south pole of the outer magnet 31 are directed towards the upper and lower ferrite core 43*a*, 43*b*. The north pole and the south pole of the inner magnet 32 are directed inwardly and outwardly, respectively, and the outwardly directed pole of the inner magnet 32, in the drawing the North pole, is identical with the pole of the outer magnet 31 which is directed to the upper ferrite core 43*a*.

It is advantageous if at least one of the voice coils used has a multilayered coil, wherein the number of windings above each other is variable along the coil. The variable coil layer thickness is preferably achieved by applying less layers, e.g. one layer in the air gap region with higher magnetic field strength, and by applying more layers, e.g. two or three layers farther away. As shown in the examples of FIGS. 3*a* and 3*b*, the voice coil has a substantially conical shape in cross section, with more windings above each other on the diaphragm side, and less windings on the other side opposite the diaphragm. In FIG. 3*a* the layer thickness changes in a stepwise manner, while according to FIG. 3*b*. the layer thickness changes more continuously, as the wire of the individual layers is located partially in the winding gaps. In accordance with the requirements and the characteristics to be achieved, it is further possible to select a number of windings or coil layers that changes along the axis linearly or non-linearly.

The material used for the permanent magnets is neodymium or it comprises neodymium, such as an alloy of neodymium, such as N52. The use of such a magnet material or a similarly high strength magnet can increase the sensitivity and the output power of the loudspeaker assembly.

The parts of the loudspeaker assembly are constructed in order to simplify the production and the assembling, and to ensure a correct locating and positioning of the individual parts. Into a cylindrical recess of the loudspeaker frame 10 fits the lower ferrite core 43*b*, which has a central opening for receiving and positioning the inner core 41 with a fitting recess. The ferrite core 43*b* carries the outer magnet 31 which is also enclosed by the cylindrical inner wall of the loudspeaker frame 10. An outer ferrite core 42 may be pulled over the inner ferrite core 41, wherein the outer core fits with its foot portion exactly to the outer diameter of the inner ferrite core 41. An upper ferrite core 43*a* may be arranged on the outer magnet 31, wherein the upper core fits with its outer diameter to the inner diameter of the receiving recess of the loudspeaker frame 10. An inner magnet 32 can be received in an inner recess of the inner ferrite core 41, wherein the upper plane surface of the inner magnet 32 is located below the upper plain surface of the inner ferrite core 41. The inner magnet 32 can be covered with a disc shaped ferrite core 44. All of the individual elements fitted to each other are located concentric relative to the axis of the loudspeaker 15. The magnets and the ferrite cores may be attached to the loudspeaker frame 10 and to each other e.g. by an adhesive.

After each magnet and ferrite core part is attached, the outer diaphragm can be inserted which is followed by the inner diaphragm, wherein both of the diaphragms can be attached through flexible suspending elements.

FIG. 4 shows the frequency response diagram of the coaxial loudspeaker arrangement according to the present invention. In the diagram the horizontal axis shows the frequency in Hz, on a logarithmic scale, while the vertical axis shows the power output of the loudspeaker in dB. The nominal power of the loudspeaker was 150 W, and the average acoustic pressure 100 dB. As shown in the drawing, the loudspeaker provided in the frequency range between 50 Hz and 10 kHz a minimum acoustic pressure of 100 dB. In the loudspeaker arrangement used for the measurement, the diameter of the outer diaphragm (subwoofer) was 35 cm, the diameter of the outer voice coil was 9.7 cm, the diameter of the inner diaphragm (tweeter) was 12.5 cm and the diameter of the inner voice coil was 6.0 cm. The magnetic flux of the outer and inner magnets was 1.4 and 2.2 T, respectively.

The invention was described in detail on the basis of examples and embodiments shown in the drawing, however, as will be apparent to those skilled in the art, numerous further modifications are possible within the scope of the invention as defined in the claims, therefore the invention is not limited by the shown embodiments.

LIST OF REFERENCES

10 loudspeaker frame
11 base plate
12-14 flexible suspension element (spider)
15 axis
21 outer diaphragm
22 outer voice coil
23 inner diaphragm
24 inner voice coil
25 dust cap
31 outer magnet
32 inner magnet
41 inner core
42 outer core
43*a* (upper) ferrite core
43*b* (lower) ferrite core
44 ferrite core
51 outer air gap
52 inner air gap

The invention claimed is:

1. Coaxial loudspeaker arrangement with an outer diaphragm (21) for operating in a lower frequency range, an inner diaphragm (23) for operating in a higher frequency range, both located in a common loudspeaker frame (10), with an outer voice coil (22) connected to the outer diaphragm (21), an inner voice coil (24) connected to the inner diaphragm (23), two coaxially arranged magnets (31, 32), and ferrite cores (41, 42, 43) in association with the magnets, wherein the voice coils (22, 24) extend into air gaps (51, 52) between the ferrite cores, and the diaphragms are connected to the loudspeaker frame (10) through flexible suspending elements (12-14), characterised in that an inner core (41) and an outer core (42) separated from each other by an inner air gap (52), are located between an outer magnet (31) and an inner magnet (32); one ferrite core (43*a*) of the outer magnet (31) is separated by an outer air gap (51) from the outer core (42) located between the two magnets, wherein the voice coil (22) of the outer diaphragm (21) extends into the outer air gap (51) and the voice coil (24) of the inner diaphragm (23) extends into the inner air gap (52).

2. The loudspeaker arrangement of claim 1, characterised in that at least a part of the inner magnet (32) and at least a part of the outer magnet (31) is located in the same plane.

3. The loudspeaker arrangement of claim 2, characterised in that the upper plane surface of the inner magnet (32) is located in proximity of the upper plane surface of the outer magnet (31), above the upper plane surface of the outer magnet (31), and the lower plane surface of the inner magnet (32) is located between the upper plane surface and the lower plane surface of the outer magnet (31).

4. The loudspeaker arrangement of claim 1, characterised in that the outer magnet (31) is located between a lower and an upper ferrite core (43*a*, 43*b*), wherein the outer diameter of the two ferrite cores (43*a*, 43*b*) is essentially equal to the outer dimension of the outer magnet (31) and the dimension of the air gap (51) between the inner diameter of the upper ferrite core (43*a*) and the outer diameter of the outer ferrite core (42) is selected in accordance with the dimension of the outer voice coil (22).

5. The loudspeaker arrangement of claim 1, characterised in that the upper plain surface of the outer ferrite core (42) is located substantially in the same plane as the upper plane surface of the upper ferrite core (43*a*), and the upper plane surface of the inner ferrite core (41) is located in proximity of the upper plane surface of the outer ferrite core (42), below the upper plane surface of the outer ferrite core (42).

6. The loudspeaker arrangement of claim 1, characterised in that the outer ferrite core (42) comprises a head portion adjacent to the inner voice coil (24), and a foot portion fitting to the inner ferrite core (41), wherein the dimension of the air gap (52) between the inner diameter of the head portion of the outer ferrite core (42) and the outer diameter of the inner ferrite core (41) is selected in accordance with the dimension of the inner voice coil (24).

7. The loudspeaker arrangement of claim 6, characterised in that a hollow middle portion is formed between the head portion and the foot portion of the outer ferrite core (42), and the head portion comprises a conical surface extending from a higher outer wall to a lower inner wall.

8. The loudspeaker arrangement of claim 1, characterised in that the inner ferrite core (41) has a substantially cylindrical shape with a recess in the upper part for receiving the inner magnet (32).

9. The loudspeaker arrangement of claim 8, characterised in that the upper plane surface of the inner ferrite core (41) is located higher than the upper plane surface of the inner magnet (32), thus the inner magnet (32) inserted into the inner ferrite core (41) is covered by a ferrite core (44) having the shape of a circular disc and fitting within the recess of the inner ferrite core (41).

10. The loudspeaker arrangement of claim 8, characterised in that in the lower region of the outer surface of the inner ferrite core (41) a circumferential recess is formed to mate with the inner edge of the lower ferrite core (43*b*).

11. The loudspeaker arrangement of claim 1, characterised in that the north pole and the south pole of the outer magnet (31) are directed towards the upper and lower ferrite core (43*a*, 43*b*).

12. The loudspeaker arrangement of claim 1, characterised in that the north pole and the south pole of the inner magnet (32) are directed inwardly and outwardly, respectively, and the outwardly directed pole of the inner magnet (32), is identical with the pole of the outer magnet (31) which is directed to the upper ferrite core (43*a*).

13. The loudspeaker arrangement of claim 1, characterised in that at least one of the voice coils (22, 24) has a multilayered coil, wherein the number of layers above each other is variable along the coil.

14. The loudspeaker arrangement of claim 13, characterised in that at least one of the voice coils (22, 24) has a substantially conical shape, with more windings above each other on the diaphragm side, and less windings on the other side opposite the diaphragm.

15. The loudspeaker arrangement of claim 1, characterised in that the material used for the magnets is neodymium or it comprises neodymium.

* * * * *